United States Patent
Gianesello et al.

(10) Patent No.: US 11,355,851 B2
(45) Date of Patent: Jun. 7, 2022

(54) ELECTRONIC DEVICE COMPRISING AN INTEGRATED ELECTROMAGNETIC ANTENNA

(71) Applicants: STMicroelectronics SA, Montrouge (FR); STMicroelectronics (Grenoble 2) SAS, Grenoble (FR)

(72) Inventors: Frederic Gianesello, Saint Jeoire Prieure (FR); Didier Campos, Charavines (FR)

(73) Assignees: STMicroelectronics SA, Montrouge (FR); STMicroelectronics (Grenoble 2) SAS, Grenoble (FR)

( * ) Notice: Subject to any disclaimer, the term of this patent is extended or adjusted under 35 U.S.C. 154(b) by 8 days.

(21) Appl. No.: 16/889,240

(22) Filed: Jun. 1, 2020

(65) Prior Publication Data

US 2020/0381833 A1    Dec. 3, 2020

(51) Int. Cl.
   *H01Q 9/04*      (2006.01)
   *H01Q 5/357*     (2015.01)
   *H01Q 1/22*      (2006.01)
   *H01Q 21/28*     (2006.01)

(52) U.S. Cl.
   CPC ........ *H01Q 9/0485* (2013.01); *H01Q 1/2283* (2013.01); *H01Q 5/357* (2015.01); *H01Q 21/28* (2013.01)

(58) Field of Classification Search
   CPC .... H01Q 9/0485; H01Q 5/357; H01Q 1/2283; H01Q 21/28; H01Q 9/0457; H01Q 1/24; H01L 2924/15174; H01L 2924/15311; H01L 2924/181; H01L 2224/16225; H01L 2223/6677; H01L 23/66; H01L 23/49816
   See application file for complete search history.

(56) References Cited

U.S. PATENT DOCUMENTS

| | | | |
|---|---|---|---|
| 10,318,859 B2 * | 6/2019 | Lowe | H01Q 1/2216 |
| 2015/0381229 A1 | 12/2015 | Tzanidis et al. | |
| 2016/0049723 A1 | 2/2016 | Baks et al. | |
| 2017/0062298 A1 | 3/2017 | Auchere et al. | |

OTHER PUBLICATIONS

INPI Search Report and Written Opinion for FR Appl. No. 1905855 dated Feb. 7, 2020 (8 pages).
Kim, Hong-Teuk, et al: "A 28-GHz CMOS Direct Conversion Transceiver With Packaged 2 × 4 Antenna Array for 5G Cellular System," IEEE Journal of Solid-State Circuits, vol. 53, No. 5, May 2018, pp. 1245-1259.
Valdes-Garcia, Alberto et al: "Circuit and Antenna-in-Package Innovations for Scaled mmWave 5G Phased Array Modules," 2018 IEEE (8 pages).

* cited by examiner

*Primary Examiner* — Seung H Lee
(74) *Attorney, Agent, or Firm* — Crowe & Dunlevy

(57) ABSTRACT

A first independent unit includes a support substrate with an integrated network of electrical connections. An electronic integrated circuit chip is mounted above a front face of the support substrate. A second independent unit includes a dielectric support. The second independent unit is stacked above the first independent unit on a side of the front face of the first independent unit. An electromagnetic antenna includes an exciter element and a resonator element. The exciter element provided at the support substrate. The resonator element is provided at the dielectric support.

27 Claims, 2 Drawing Sheets

ELECTRONIC DEVICE COMPRISING AN INTEGRATED ELECTROMAGNETIC ANTENNA

PRIORITY CLAIM

This application claims the priority benefit of French Application for Patent No. 1905855, filed on Jun. 3, 2019, the content of which is hereby incorporated by reference in its entirety to the maximum extent allowable by law.

TECHNICAL FIELD

The present invention relates to the field of electronic devices provided with electronic integrated circuit (IC) chips and with electromagnetic antennas for transmitting and/or receiving electromagnetic signals.

BACKGROUND

In the prior art, there are electronic devices that comprise a multilayer dielectric support substrate including an integrated network of electrical connections and at least one integrated circuit (IC) chip mounted on a front face of the support substrate and connected to the network of electrical connections. To transmit and/or receive electromagnetic signals, such electronic devices are provided with an electromagnetic antenna, generally called capacitive slot-coupled antenna, that comprises an exciter element and a resonator element that are integrated into metal levels of the dielectric support substrate.

However, integrating the network of electrical connections and the electromagnetic antenna requires producing a dielectric support substrate having a large number of stacked dielectric layers and requires difficult adjustment of the positioning and of the dimensioning of the antenna with respect to the network of electrical connections.

There is a need in the art to reduce these drawbacks.

SUMMARY

According to one embodiment, what is proposed is an electronic device that comprises a first independent unit comprising a support substrate including an integrated network of electrical connections, at least one electronic integrated circuit (IC) chip mounted above a front face of the support substrate and a second independent unit comprising a dielectric support, wherein the second independent unit is applied above the first independent unit, on the side of the front face of this first independent unit, and that comprises at least one electromagnetic antenna comprising an exciter element and a resonator element, the support substrate being provided with the exciter element and the dielectric support being provided with the resonator element.

The integration of the electromagnetic antenna is thus simplified.

The exciter element may comprise a local ground metal sheet or layer provided with a slot and a power supply line facing this slot.

The network of electrical connections of the support substrate may comprise metal electrical connection pads formed in the front face, the local ground metal sheet or layer being in the same metal level as these electrical connection pads, and the power supply line is formed in a metal level situated below the metal level containing the local ground metal sheet or layer.

The resonator element may comprise a local metal sheet or layer.

The dielectric support may comprise a dielectric substrate, the resonator element being integrated and formed on the side of one of the faces of this dielectric substrate.

The device may comprise means for mounting the second independent unit above the first independent unit.

The means for mounting may be interposed between the first independent unit and a rear face of the dielectric support of the second independent unit.

The means for mounting may comprise mounting elements interposed between the front face of the support substrate of the first independent unit and the rear face of the dielectric support of the second independent unit.

The mounting elements may be interposed and soldered between pads of the front face of the support substrate of the first independent unit and pads of the rear face of the dielectric support of the second independent unit.

The first independent unit may comprise an encapsulation block above the front face and in which the IC chip is embedded, the means for mounting comprising a layer of adhesive between a face of the encapsulation block and a rear face of the dielectric support of the second independent unit.

The device may comprise means for electrically connecting the resonator element of the second independent unit to the network of electrical connections of the first independent unit.

The device may comprise a dielectric reception substrate having a front face above which the first independent unit is mounted, on the side of a rear face of the dielectric support substrate of the first independent unit.

The device may comprise means for mounting the second independent unit above the dielectric reception substrate.

The means for mounting may be interposed between a rear face of the second independent unit and a front face of the dielectric reception substrate and pass laterally to and spaced from the first independent unit.

The means for mounting may comprise columns the ends of which are fixed above the rear face of the second independent unit and the front face of the dielectric reception substrate.

BRIEF DESCRIPTION OF THE DRAWINGS

Electronic devices will now be described by way of non-limiting exemplary embodiments, illustrated by the appended drawing in which.

DETAILED DESCRIPTION

Figure 1:
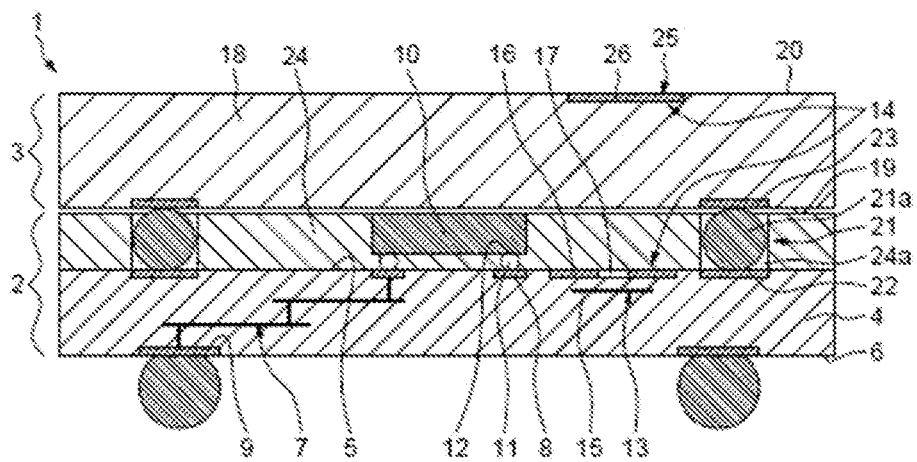
FIG. 1 shows a section through an electronic device including an electromagnetic antenna.

According to one variant embodiment illustrated in FIG. 1, an electronic device 1 comprises a first independent unit 2 and a second independent unit 3 applied, stacked or situated above the first independent unit 2.

The first independent unit 2 and the second independent unit 3 are said to be "independent" because they are produced or manufactured independently, and the electronic device 1 is therefore heterogeneous. The independently manufactured units 2, 3 are then assembled together to form the electronic device 1.

The first independent unit 2 comprises a dielectric support substrate 4, in the form of a wafer, that has a front face 5 and a rear face 6 and that includes an integrated network of electrical connections 7.

The integrated network of electrical connections 7 comprises metal tracks that extend in metal levels formed between stacked dielectric layers of the support substrate 4 and metal vias linking these tracks through these layers. The integrated network of electrical connections 7 also comprises front metal pads 8 that are included in the front face 5 and rear metal pads 9 that are included in the rear face 6 of the support substrate 4.

The first independent unit 2 comprises at least one electronic integrated circuit (IC) chip 10 that is mounted above the front face 5 of the support substrate 4 by way of electrical connection elements 11, for example metal balls, that are interposed and soldered between at least some of the front pads 8 of the support substrate 4 and at least some of the pads 12 of the chip 10. The chip 10 may thus be connected to at least some of the rear pads 9 of the support substrate 4.

The first independent unit 2 is provided with an exciter element 13 that forms part of an electromagnetic antenna 14 and that is carried by the support substrate 4. The exciter element 13 is situated in an area of the support substrate 4 that is not covered by the chip 10 (i.e., it is laterally offset from the mounting location of the chip and is therefore not covered by any part of the chip).

Specifically, the exciter element 13 comprises an integrated power supply or transmission line 15 and a local ground metal sheet or layer 16 provided with a local slot 17.

The local ground metal sheet or layer 16 extends, for example, in the same metal level as the front pads 8 of the network of electrical connections 7 at a position laterally offset from the mounting area of the chip. The front pads 8 and the local ground metal sheet or layer 16 may thus be created during the same production operations.

The integrated power supply or transmission line 15 extends in a metal level of the support substrate 4 that is situated below the metal level of the ground metal sheet or layer 16, at least partly below the local slot 17, and is linked to the network of electrical connections 7 so as to be connected, for example, to at least one pad 12 of the chip 10.

The second independent unit 3 comprises a dielectric support 18, in the form of a wafer, having a rear face 19 facing the first independent unit 3, on the side of the front face 5, and a front face 20. The dielectric support 18 is positioned to extend over and cover the chip 10.

According to this variant embodiment, the dielectric support 18 is formed by a dielectric substrate.

The electronic device 1 comprises a means for mounting 21 the second independent unit 3 above the first independent unit 2. The means for mounting 21 is spaced from one another and distributed appropriately. For example, the means for mounting 21 may be arranged in the vicinity of the corners and/or middles of the edges of the first independent unit 2 and/or of the second independent unit 3.

The means for mounting 21 are formed as follows.

The support substrate 4 comprises specific mounting front metal pads 22 that are integrated into its front face 5 and formed in the same metal level as the front metal pads 8. The specific mounting pads 22 are not linked to the network of electrical connections 7. The front pads 8 and the mounting front pads 22 may be created during the same production operations.

The dielectric support 18 comprises specific mounting rear metal pads 23 that are integrated into its rear face 19, in a rear metal level.

The means for mounting 21 comprise metal mounting elements 21*a* that are interposed and soldered between the front mounting pads 22 of the support substrate 4 and the rear mounting pads 23 of the dielectric support 18.

Advantageously, the first independent unit 2 is provided with an encapsulation block 24 formed on the front face 5 of the support substrate 4 and in which the chip 10 is embedded.

The encapsulation block 24 is provided with through-holes 24*a* into which the electrical connection elements are placed.

The second independent unit 3 is provided with a resonator element 25 that forms another part of the electromagnetic antenna 14 and that is carried by the dielectric support 18.

Specifically, the resonator element 25 of the electromagnetic antenna 14 is formed by a local metal sheet or layer 26 integrated into the front face 20 of the dielectric support 18, in a front metal level.

The local metal sheet or layer 26 is situated above the local metal sheet or layer 16 of the exciter element 13 when the second independent unit 3 is stacked on top of the first independent unit 2. In other words, the local metal sheet or layer 26 is aligned with the local metal sheet or layer 16 in a vertical direction perpendicular to the surface 5.

With this relative positioning, the exciter element 13 and the resonator element 25 of the electromagnetic antenna 14 are configured, oriented, positioned and spaced such that there is capacitive coupling between them.

When the integrated power supply or transmission line 15 of the exciter element 13 is subjected to a modulated electrical signal coming, for example, from the chip 10 via the network of electrical connections 7, the integrated power supply or transmission line 15 radiates through the slot 17 of the ground sheet or layer 16 so as to make the local metal sheet or layer 26 of the resonator element 25 resonate. The electromagnetic antenna 14 then transmits an electromagnetic signal corresponding to the electrical signal of the power supply or transmission line 15.

By contrast, when the electromagnetic antenna 14 is subjected to an electromagnetic signal, this signal is sensed and the corresponding electrical signal of the power supply or transmission line 15 is able to be transmitted for example to the electronic chip 10 via the network of electrical connections 7.

According to one exemplary embodiment, the local metal sheet or layer 16 has a rectangular perimeter and the slot 17 is formed through the central area thereof and has four branches that oppose one another in pairs. The local metal sheet or layer 25 has a rectangular perimeter. Other shapes are possible.

According to one variant embodiment, the local metal sheet or layer 26 of the resonator element 25 could be formed in the rear face 19 of the dielectric support 18, in the same rear metal level as the rear pads 23.

Figure 2:
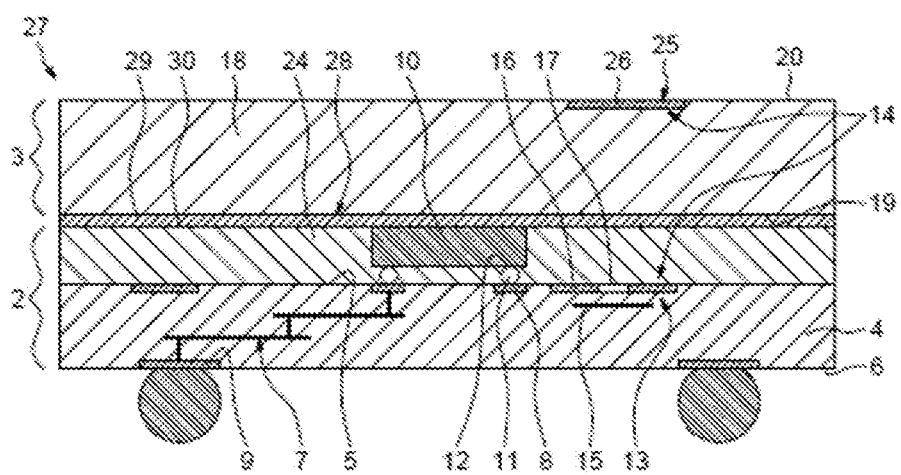
FIG. 2 shows a section through another electronic device including an electromagnetic antenna.

According to another variant embodiment illustrated in FIG. 2, an electronic device 27 comprises the first independent unit 2 of the electronic device 1, without the front mounting pads 22 and without the holes 24*a* in the encapsulation block 24, and the second independent unit 3 of the electronic device 1, without the rear mounting pads 23. The mounting elements 21 are also non-existent.

In this electronic device 27, the second independent unit 3 is mounted above the first independent unit 2 by way of means for mounting 28 formed by a layer of adhesive 29 interposed between a front face 30 of the encapsulation block 24 of the first independent unit 2 and the rear face 19 of the dielectric support 18 of the second independent unit 3.

Figure 3:
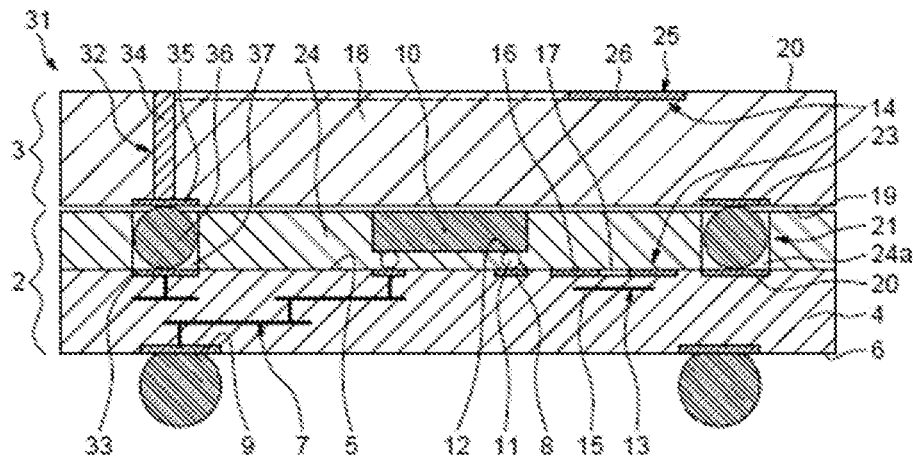
FIG. 3 shows a section through another electronic device including an electromagnetic antenna.

According to another variant embodiment illustrated in FIG. 3, an electronic device 31 differs from the electronic device 1 in that it furthermore comprises an electrical connection 32 between the network of electrical connections 7 of the first independent unit 2 and the resonator element 25 of the second independent unit 3, in order to link the resonator element 25 to the chip 10 and/or to a rear pad 8 of the support substrate 4.

The electrical connection 32 comprises a front pad 33 formed in the front face 5 of the support substrate 4, in the same metal level as the front pads 8, a connection via 34 that passes through the dielectric support 18 and the front end of which is linked to the metal sheet or layer 26 of the resonator element, and a rear pad 35 formed in the rear face 19 of the dielectric support 18.

The electrical connection 32 furthermore comprises an electrical connection element 36, for example a metal ball, that is interposed and soldered between the front pad 33 and the rear pad 35, the electrical connection element 36 being situated in a hole 37 of the encapsulation block 24.

The electrical connection 32 may also be introduced into the electronic device 27 of FIG. 2.

Figure 4:
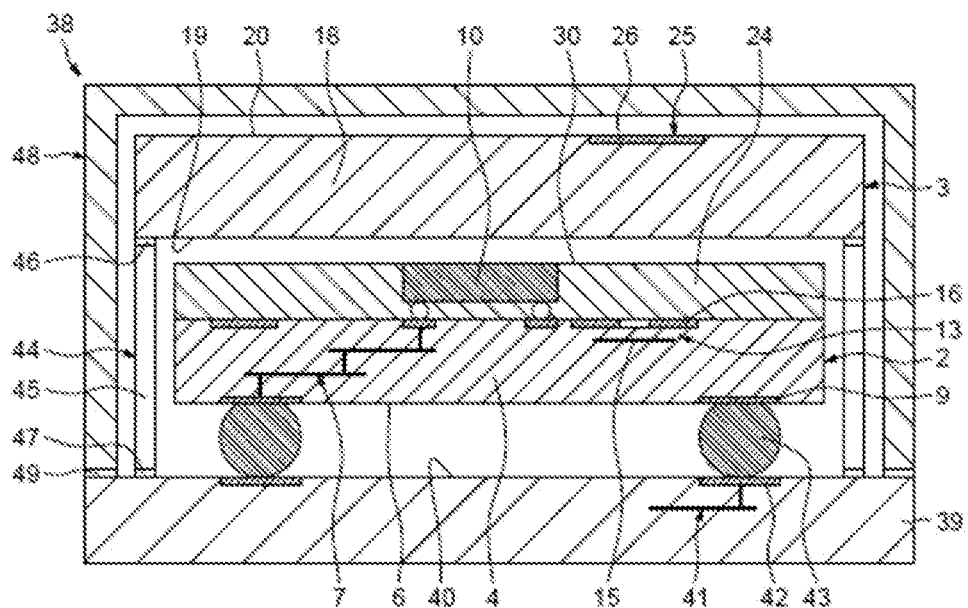
FIG. 4 shows a section through another electronic device including an electromagnetic antenna.

According to another variant embodiment illustrated in FIG. 4, an electronic device 38 comprises a first independent unit 2 and a second independent unit 3 that are equivalent per se to those in the variant embodiment described with reference to FIG. 2.

This time, the second independent unit 3 is applied or situated above the first independent unit 2 but is not fixed directly thereto, the front face 30 of the first independent unit 2, as above, facing the rear face 19 of the second independent unit 3.

The electronic device 38 furthermore comprises a dielectric reception substrate 39, in the form of a sheet, a front face 40 of which is situated facing and spaced from the rear face 6 of the support substrate 4.

The reception substrate 39 comprises an integrated network of electrical connections 41 provided with front electrical connection pads 42 formed in its front face 39.

To connect the support substrate 4 and the reception substrate 39, electrical connection elements 43 are interposed and soldered between the rear pads 9 of the support substrate 4 of the first independent unit 2 and the front pads 42 of the reception substrate 39.

In the electronic device 38, the second independent unit 3 is held above and spaced from the first independent unit 2 by way of means for mounting 44 that extend laterally to and spaced from the first independent unit 2 and that are interposed between the reception substrate 39 and the dielectric support 18 of the second independent unit 3, in a position such that the metal sheet or layer 26 of the resonator element 25 of the second independent unit 3 faces the metal sheet or layer 16 of the exciter element 25 of the first independent unit 2.

The metal sheet or layer 26 of the resonator element 25 may be formed either in the rear face 19 or in the front face 20 of the dielectric substrate 18.

The means for mounting 44 comprise, for example, columns 45 that are spaced from one another and the ends of which are fixed respectively above the rear face 19 of the substrate 18 of the second independent unit 3 and above the front face 40 of the reception substrate 39, by way of dots of adhesive 46 and 47.

The electronic device 38 may furthermore comprise a dielectric hood 48, in the form of a bowl, inside which the units 2 and 3 are positioned and the peripheral edge of which is fixed above the front face 40 of the reception substrate 39 by way of a line of adhesive 49.

The transmission/reception frequencies of the electromagnetic antenna 14 may advantageously be set between twenty-five and thirty gigahertz.

The invention claimed is:

1. An electronic device, comprising:
   a first independent unit comprising a support substrate including an integrated network of electrical connections, and at least one electronic integrated circuit (IC) chip mounted above a front face of the support substrate;
   a second independent unit comprising a dielectric support;
   wherein the second independent unit is mounted in a position above the first independent unit on a side of a front face of the first independent unit extending over the IC chip;
   an electromagnetic antenna comprising an exciter element and a resonator element, wherein the exciter element is located at the support substrate of the first independent unit laterally offset from the IC chip and wherein the resonator element is located at the dielectric support of the second independent unit in vertical alignment with the exciter element;
   wherein the exciter element comprises a local ground metal sheet or layer provided with a slot and a power supply line facing the slot; and
   wherein the network of electrical connections of the support substrate comprises metal electrical connection pads formed in the front face, the local ground metal sheet or layer being in a same metal level as the electrical connection pads, and the power supply line is formed in a metal level situated below the metal level containing the local ground metal sheet or layer.

2. The device according to claim 1, wherein the resonator element comprises a local metal sheet or layer.

3. The device according to claim 1, wherein the dielectric support comprises a dielectric substrate, the resonator element being integrated and formed on a side of one face of the dielectric substrate.

4. The device according to claim 1, further comprising means for mounting the second independent unit above the first independent unit.

5. The device according to claim 4, wherein the means for mounting are interposed between the first independent unit and a rear face of the dielectric support of the second independent unit.

6. The device according to claim 4, wherein the means for mounting comprise mounting elements interposed between the front face of the support substrate of the first independent unit and the rear face of the dielectric support of the second independent unit.

7. The device according to claim 6, wherein the mounting elements are interposed and soldered between pads of the front face of the support substrate of the first independent unit and pads of the rear face of the dielectric support of the second independent unit.

8. The device according to claim 4, wherein the first independent unit comprises an encapsulation block above the front face and in which the IC chip is embedded, and wherein the means for mounting comprises a layer of adhesive between a front face of the encapsulation block and a rear face of the dielectric support of the second independent unit.

9. The device according to claim 1, further comprising means for electrically connecting the resonator element of the second independent unit to the network of electrical connections of the first independent unit.

10. An electronic device, comprising:
a first independent unit comprising a support substrate including an integrated network of electrical connections, and at least one electronic integrated circuit (IC) chip mounted above a front face of the support substrate;
a second independent unit comprising a dielectric support;
wherein the second independent unit is mounted in a position above the first independent unit on a side of a front face of the first independent unit extending over the IC chip;
an electromagnetic antenna comprising an exciter element and a resonator element, wherein the exciter element is located at the support substrate of the first independent unit laterally offset from the IC chip and wherein the resonator element is located at the dielectric support of the second independent unit in vertical alignment with the exciter element;
a dielectric reception substrate having a front face above which the first independent unit is mounted, on a side of a rear face of the dielectric support substrate of the first independent unit, and
means for mounting the second independent unit above the dielectric reception substrate.

11. The device according to claim 10, wherein the means for mounting are interposed between a rear face of the second independent unit and a front face of the dielectric reception substrate and pass laterally to and spaced from the first independent unit.

12. The device according to claim 11, wherein the means for mounting comprise columns having ends which are fixed above the rear face of the second independent unit and the front face of the dielectric reception substrate.

13. The device according to claim 10, wherein the exciter element comprises a local ground metal sheet or layer provided with a slot and a power supply line facing the slot.

14. The device according to claim 10, wherein the resonator element comprises a local metal sheet or layer.

15. The device according to claim 10, wherein the dielectric support comprises a dielectric substrate, the resonator element being integrated and formed on a side of one face of the dielectric substrate.

16. The device according to claim 10, further comprising means for electrically connecting the resonator element of the second independent unit to the network of electrical connections of the first independent unit.

17. An electronic device, comprising:
a first independent unit comprising a support substrate including an integrated network of electrical connections;
at least one electronic integrated circuit (IC) chip mounted above a front face of the support substrate;
a second independent unit comprising a dielectric support;
wherein the second independent unit is mounted to the first independent unit on a side of a front face of the first independent unit;
wherein the dielectric support of the second independent unit includes a first portion covering the IC chip and a second portion laterally offset from the IC chip; and
an electromagnetic antenna comprising an exciter element and a resonator element, wherein the exciter element is located at the support substrate of the first independent unit laterally offset from the IC chip and wherein the resonator element is located in the second portion of the dielectric support in vertical alignment with the exciter element.

18. The device according to claim 17, wherein the exciter element comprises a local ground metal sheet or layer provided with a slot and a power supply line facing the slot.

19. The device according to claim 18, wherein the network of electrical connections of the support substrate comprises metal electrical connection pads formed in the front face, the local ground metal sheet or layer being in a same metal level as the electrical connection pads, and the power supply line is formed in a metal level situated below the metal level containing the local ground metal sheet or layer.

20. The device according to claim 17, wherein the resonator element comprises a local metal sheet or layer.

21. The device according to claim 17, wherein the dielectric support comprises a dielectric substrate, the resonator element being integrated and formed on a side of one face of the dielectric substrate.

22. The device according to claim 17, further comprising means for electrically connecting the resonator element of the second independent unit to the network of electrical connections of the first independent unit.

23. An electronic device, comprising:
a first independent unit comprising a support substrate including an integrated network of electrical connections, at least one electronic integrated circuit (IC) chip mounted above a front face of the support substrate, and an encapsulation block above the front face and in which the IC chip is embedded;
a second independent unit comprising a dielectric support;
wherein the second independent unit is mounted to the encapsulation block extending over the IC chip; and
an electromagnetic antenna comprising an exciter element and a resonator element, wherein the exciter element is located at the support substrate of the first independent unit laterally offset from the IC chip and wherein the resonator element is located in the second portion of the dielectric support in vertical alignment with the exciter element.

24. The device according to claim 23, wherein the second independent unit is mounted to the encapsulation block by an adhesive layer.

25. The device according to claim 23, further comprising mounting elements interposed between the front face of the support substrate of the first independent unit and the rear face of the dielectric support of the second independent unit.

26. The device according to claim 23, wherein said mounting elements extend through openings in the encapsulation block.

27. The device according to claim 26, wherein said mounting elements are interposed and soldered between pads of the front face of the support substrate of the first independent unit and pads of the rear face of the dielectric support of the second independent unit.

* * * * *